(12) United States Patent
Chen (10) Patent No.: US 9,379,088 B2
(45) Date of Patent: Jun. 28, 2016

(54) STACKED PACKAGE OF VOLTAGE REGULATOR AND METHOD FOR FABRICATING THE SAME

(71) Applicant: Silergy Semiconductor Technology (Hangzhou) Ltd., Hangzhou (CN)

(72) Inventor: Wei Chen, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 143 days.

(21) Appl. No.: 14/469,742

(22) Filed: Aug. 27, 2014

(65) Prior Publication Data
US 2015/0062836 A1    Mar. 5, 2015

(30) Foreign Application Priority Data

Aug. 27, 2013    (CN) .......................... 2013 1 0378482

(51) Int. Cl.
| H05K 1/00 | (2006.01) |
| H05K 1/18 | (2006.01) |
| H05K 7/00 | (2006.01) |
| H01L 25/00 | (2006.01) |
| H01L 23/495 | (2006.01) |
| H02M 7/00 | (2006.01) |

(52) U.S. Cl.
CPC .......... H01L 25/00 (2013.01); H01L 23/49537 (2013.01); H01L 23/49562 (2013.01); H01L 23/49575 (2013.01); H01L 2224/16245 (2013.01); H01L 2224/48091 (2013.01); H01L 2224/48137 (2013.01); H01L 2924/13091 (2013.01); H02M 7/003 (2013.01); Y10T 29/49128 (2015.01)

(58) Field of Classification Search
USPC .................................. 361/748, 679.01, 720
See application file for complete search history.

(56) References Cited

U.S. PATENT DOCUMENTS

2009/0207574 A1* 8/2009 Chen ...................... H05K 1/181
                                                                361/761
2010/0225007 A1* 9/2010 Pagaila ................... H01L 24/32
                                                                257/778

FOREIGN PATENT DOCUMENTS

| CN | 101814480 A | 8/2010 |
| CN | 102832189 A | 12/2012 |

* cited by examiner

*Primary Examiner* — Andargie M Aychillhum
(74) *Attorney, Agent, or Firm* — Westman, Champlin & Koehler, P.A.

(57) ABSTRACT

The present disclosure relates to a stacked package of a voltage regulator and a method for fabricating the same. The method comprises: providing a first chip and a second chip which are integrated with each other, the first chip and the second chip each having a front surface provided with a plurality of bumps; forming a non-conductive layer and a conductive layer side by side on the back surface of the second chip; providing a first leadframe and a second leadframe each having at least a group of leads, the plurality of bumps on the first chip being electrically coupled to the first leadframe, the plurality of bumps on the second chip being electrically coupled to the second leadframe, and the back surface of the second chip being electrically coupled to a back surface of the first leadframe; the first leadframe being electrically coupled to the second leadframe; the first chip, the second chip, the conductive layer, the non-conductive layer, the bumps, the first leadframe, and the second leadframe forms a stacked package to reduce the footprint of a chip and reducing manufacture cost.

15 Claims, 7 Drawing Sheets

FIG. 5 ns the front surface of the first chip to the leads of the first

STACKED PACKAGE OF VOLTAGE REGULATOR AND METHOD FOR FABRICATING THE SAME

RELATED APPLICATIONS

This application claims the benefit of Chinese Patent Application No. 201310378482.X, filed on Aug. 27, 2013, which is incorporated herein by reference in its entirety.

TECHNICAL FIELD

The present disclosure generally relates to the field of semiconductor chip package, and more specifically, to a stacked package of a voltage regulator and a method for fabricating the same.

BACKGROUND

As the demand for miniaturization, low manufacture cost, high density and multi-functionality of electronic products, chip packages continue to advance towards the package technology that a plurality of dies are encapsulated in one encapsulant.

An example of a switching voltage regulator will now be described to show some features of the prior package technology, with reference to FIG. 1A to 1C. As will be described below, the switching voltage regulator has a multi-chip package structure.

Figure 1A:
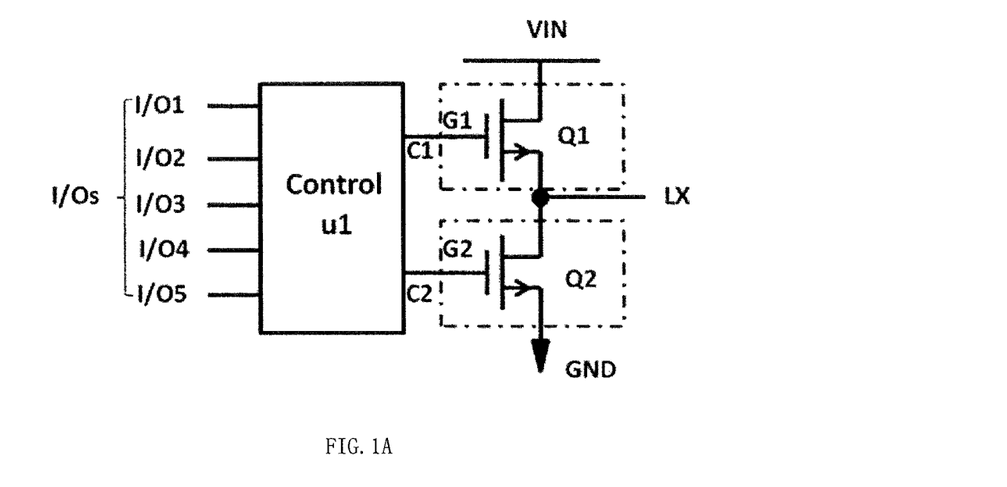
FIG. 1A illustrates a schematic diagram of an example structure of a conventional switching voltage regulator.
Figure 1B:
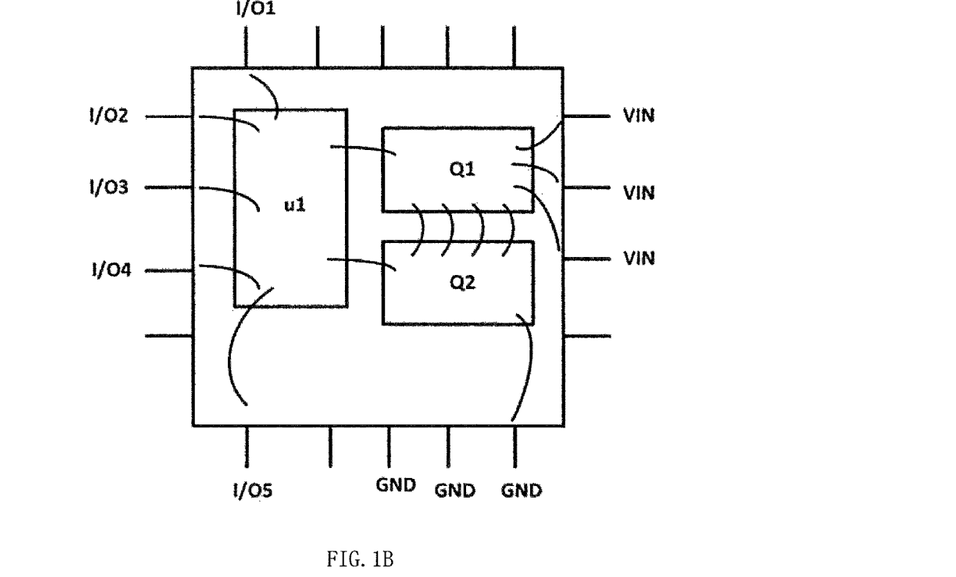
FIG. 1B is a top view showing an example multi-chip package structure of a conventional switching voltage regulator.
Figure 1C:
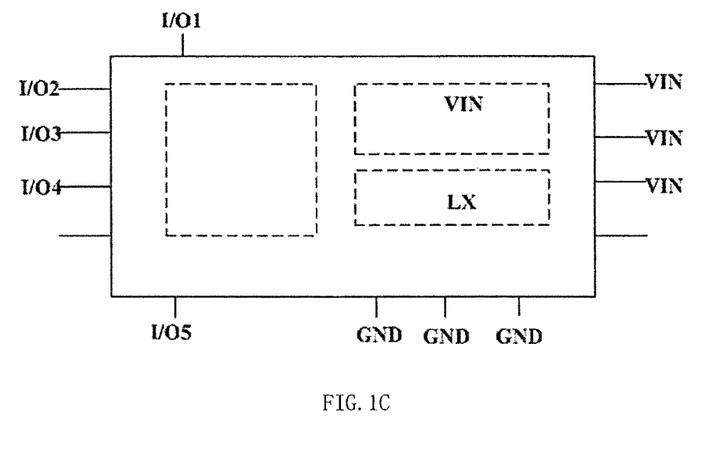
FIG. 1C is a top view showing an example multi-chip package structure after encapsulation of a conventional switching voltage regulator.

FIG. 1A illustrates a schematic diagram of an example structure of a switching voltage regulator. The switching voltage regulator includes a control chip u1, a top power switch Q1 and a bottom power switch Q2, all of which are independent components. For example, the top power switch and the bottom power switch are both MOSFETs. The control chip has 5 I/O terminals I/O1-I/O5, 2 driving terminals C1 and C2. The control chip provides signals from the driving terminals C1 and C2 to gates G1 and G2 of the two power switches Q1 and Q2 to control their on-off state. A drain of the power switch Q1 is electrically coupled to an input power supply VIN, a source of the power switch Q1 is electrically coupled to a drain of the power switch Q2, and a source of the power switch Q2 is grounded. The drain of the power switch Q2 provides an output signal LX. A chip package may be formed by the prior package technology, which incorporates the switching voltage regulator as shown in FIG. 1A. Top views of the resultant multi-chip package structure before and after encapsulation are shown in FIGS. 1B and 1C, respectively. In the multi-chip package structure shown in FIGS. 1B and 1C, the control chip u1 and the power switches Q1 and Q2 are substantially coplanar with each other, and arranged on a carrier of a leadframe. Pads of each chip are electrically coupled to the corresponding leads of the leadframe by bonding wires, so that the chip may be further electrically coupled to an external printed circuit board.

An important concern in the chip package technology is a ratio of a chip footprint to a package area. The package technology is advantageous if the ratio has a value of approximately 1. However, the above chip package structure means that the chip package has an area at least larger than a sum of the three independent chips. Consequently, it has a large package area and results in a high manufacture cost.

SUMMARY

One object of the present disclosure is to provide a stacked package of a voltage regulator and a method for fabricating the same.

To solve the above problem, there is provided a method for fabricating a stacked package of a voltage regulator, comprising:

forming a first chip by integrating a gate driving circuit with a first power switch, forming a second chip having a second power switch, arranging a plurality of terminals on a front surface of the first chip and on a front surface of the second chip, and arranging a plurality of terminals on a back surface of the second chip;

forming a group of bumps corresponding to the plurality of terminals on the front surface of the first chip and on the front surface of the second chip;

forming a non-conductive layer and conductive layer side by side on the back surface of the second chip, for electrically insulating the first chip from the second chip and electrically coupling the first chip to the second chip respectively;

providing a first leadframe and a second leadframe each having at least a group of leads, all of the leads of the first leadframe being electrically coupled to the terminals on the front surface of the first chip by means of the bumps of the first chip, and some of the leads of the second leadframe being electrically coupled to the terminals on the front surface of the second chip by means of the bumps of the second chip;

electrically coupling the back surface of the first leadframe to the back surface of the second chip;

electrically coupling the leads of the first leadframe to the corresponding ones of the second leadframe by using a group of electrical wires so that the leads of the second leadframe may be coupled to an external circuit; and encapsulating the first chip, the second chip, the conductive layer, the non-conductive layer, the plurality of bumps, the first leadframe, the second leadframe and the group of electrical wires in a stacked package.

Preferably, the method further comprises: attaching a printed circuit to the back surface of the second leadframe.

Preferably, the leads are finger-like or block-like.

Preferably, the conductive layer has a thickness the same as that of the non-conductive layer.

Preferably, the conductive layer has an area larger than that of the non-conductive layer.

Preferably, the electrical wires are copper clips.

Preferably, the bumps are one selected from the group consisting of copper posts, solder bumps, and composite bumps formed by electroless nickel immersion gold.

Preferably, the voltage regulator is a switching voltage regulator.

Another object is to provide a stacked package comprising:

a first chip having a gate driving circuit and a first power switch which are integrated with each other, the first chip having a front surface with a plurality of terminals thereon;

a second chip having a second power switch, the second chip having a front surface and a back surface with a plurality of terminals thereon;

a non-conductive layer and conductive layer side by side on the back surface of the second chip, for electrically insulating the first chip from the second chip and electrically coupling the first chip to the second chip respectively;

a first leadframe and a second leadframe each having at least a group of leads, the back surface of the first leadframe being electrically coupled to the back surface of the second chip;

a group of bumps corresponding to the terminals on the front surface of the first chip and on the front surface of the second chip respectively, for electrically coupling the terminals on the front surface of the first chip to the leads of the first leadframe and electrically coupling the terminals on the front surface of the second chip to some of the leads of the second leadframe respectively;

a group of electrical wires for electrically coupling the leads of the first leadframe to the leads of the second leadframe; and an encapsulant for encapsulating the first chip, the second chip, the conductive layer, the non-conductive layer, the plurality of bumps, the first leadframe, the second leadframe and the group of electrical wires.

Preferably, the voltage regulator further comprises: a printed circuit attaching to the back surface of the second leadframe.

Preferably, the leads are finger-like or block-like.

Preferably, the conductive layer has a thickness the same as that of the non-conductive layer.

Preferably, the conductive layer has an area larger than that of the non-conductive layer.

Preferably, the electrical wires are copper clips.

Preferably, the bumps are one selected from the group consisting of copper posts, solder bumps, and composite bumps formed by electroless nickel immersion gold.

In view of that above technical solutions, the present disclosure relates to a method for fabricating a stacked package of a voltage regulator, comprises: forming a first chip by integrating a gate driving circuit with a first power switch, forming a second chip having a second power switch, arranging a plurality of terminals on a front surface of the first chip and on a front surface of the second chip, and arranging a plurality of terminals on a back surface of the second chip; forming a group of bumps corresponding to the plurality of terminals on the front surface of the first chip and on the front surface of the second chip; forming a non-conductive layer and conductive layer side by side on the back surface of the second chip, for electrically insulating the first chip from the second chip and electrically coupling the first chip to the second chip respectively; providing a first leadframe and a second leadframe each having at least a group of leads, all of the leads of the first leadframe being electrically coupled to the terminals on the front surface of the first chip by means of the bumps of the first chip, and some of the leads of the second leadframe being electrically coupled to the terminals on the front surface of the second chip by means of the bumps of the second chip; electrically coupling the back surface of the first leadframe to the back surface of the second chip; electrically coupling the leads of the first leadframe to the corresponding ones of the second leadframe by using a group of electrical wires; and encapsulating the first chip, the second chip, the conductive layer, the non-conductive layer, the plurality of bumps, the first leadframe, the second leadframe and the group of electrical wires in a stacked package. In the present method for fabricating the stacked package, the conductive layer and the non-conductive layer are used for electrically insulating and coupling different parts of the integrated circuit. The stacked package of the voltage regulator is obtained by stacking the first chip on the second chip by using the first leadframe and the second leadframe. Thus, the stacked package formed by the present method has a small size, a high integration density and improved performance. Moreover, no bonding wires are used in the chip package where the first chip is stacked on the second chip by using a first leadframe and a second leadframe, which results in less power loss and higher efficiency.

DESCRIPTION OF EMBODIMENTS

Objects, features and advantages of the present disclosure will become apparent from the following detailed description of particular embodiments of the present disclosure, with reference to the accompanying drawings.

Some particular details will be described for thorough understanding of the present disclosure. However, the present disclosure may be practiced with or without these particular details by one skilled person, without departing the principles of the present disclosure. Thus, the present disclosure is not limited to the particular embodiments below.

Figure 2:
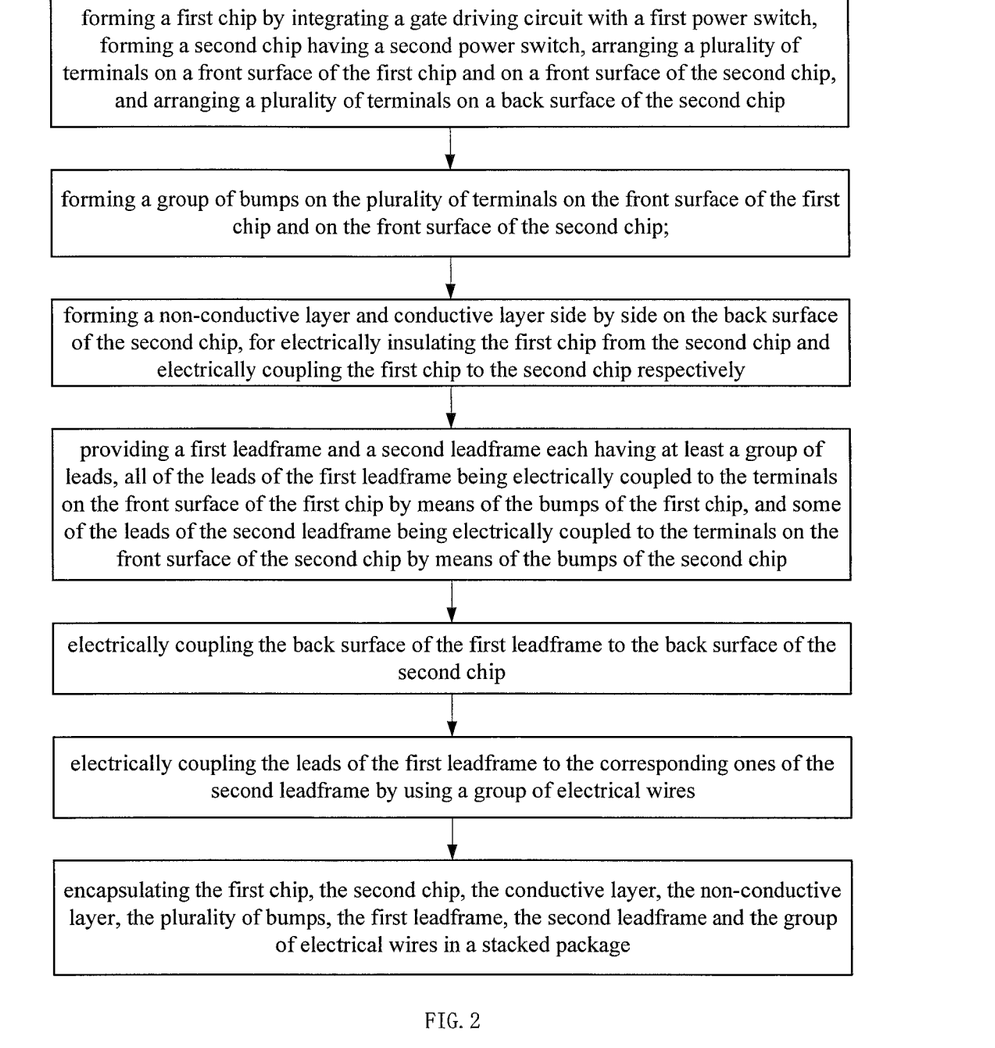
FIG. 2 illustrates a flow chart of a method for fabricating a stacked package of a voltage regulator according to an embodiment of the present disclosure.

As an example, a method for fabricating a stacked package of a voltage regulator according to the present disclosure will be described with reference to the flow chart shown in FIG. 2, in connection with FIGS. 3A to 3J. The method may be used for a switching voltage regulator circuit.

Figure 3A:
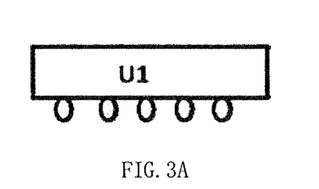
FIGS. 3A to 3J are cross-sectional views in various stages of a method for fabricating a stacked package of a voltage regulator according to an embodiment of the present disclosure.
Figure 3B:
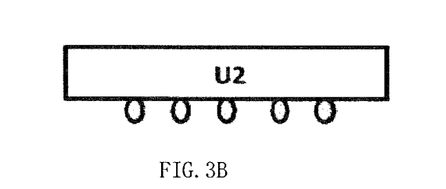

Firstly, a first chip U1 is formed by integrating a gate driving circuit u1 with a power switch Q1, as shown in FIG. 3A. The first chip U1 has a front surface and a back surface. A source terminal, a drain terminal, a gate terminal, I/O terminals and driving terminals are arranged on the front surface of the first chip U1. Moreover, a group of conductive bumps are formed for the respective terminals on the front surface of the first chip U1. A second chip U2 is formed by incorporating a power switch Q2, as shown in FIG. 3B. The second chip U2 also has a front surface and a back surface. A gate terminal and a source terminal are arranged on the front surface of the second chip, and a drain terminal is arranged on the back surface of the second chip. Moreover, a group of conductive bumps are formed for the respective terminals on the front surface of the second chip U2.

Alternatively, a first chip U1 is formed by integrating a gate driving circuit u1 with a power switch Q2, as shown in FIG. 3A. The first chip U1 has a front surface and a back surface. A source terminal, a drain terminal, a gate terminal, I/O terminals and driving terminals are arranged on the front surface of the first chip U1. Moreover, a group of conductive bumps are formed for the respective terminals on the front surface of the first chip U1. A second chip U2 is formed by incorporating a power switch Q1, as shown in FIG. 3B. The second chip U2 also has a front surface and a back surface. A gate terminal and a drain terminal are arranged on the front surface of the second chip, and a source terminal is arranged on the back surface of the second chip. Moreover, a group of conductive bumps are formed for the respective terminals on the front surface of the second chip U2.

Only the previous arrangement will be described in the following steps, as an example of the method for fabricating the stacked package of the voltage regulator according to the present disclosure. However, it will be understood by one skilled person that the other arrangement may also be used in the method for fabricating the stacked package of the voltage regulator according to the present disclosure.

Figure 4:
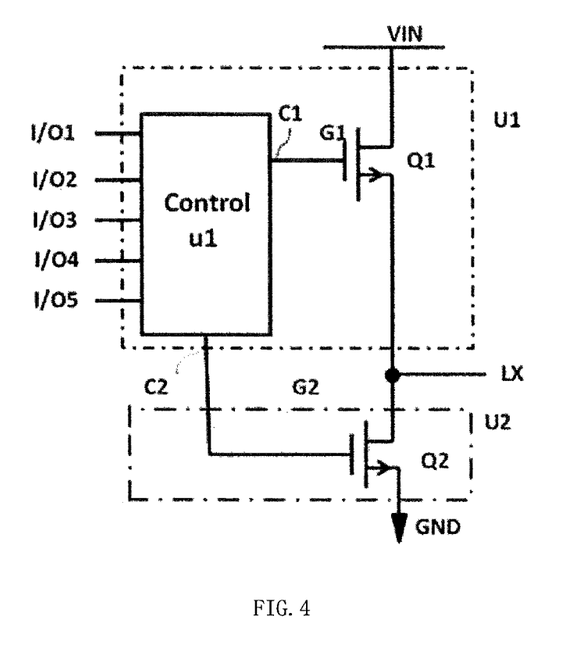
FIG. 4 illustrates a schematic diagram of an example structure of a switching voltage regulator which incorporates a first chip and a second chip according to an embodiment of the present disclosure.

In the present embodiment, the two power switches Q1 and Q2 are metal-oxide-semiconductor field effect transistors (MOSFETs). It should be understood that the two power switches may be any semiconductor switches in the art. Specifically, the gate driving circuit u1 has input/output terminal I/Os and driving output terminals C1 and C2, as shown in FIG. 4. The driving output terminal C1 is electrically coupled to a gate G1 of the power switch Q1. Only the driving output terminal C2 will be described below, because the gate driving circuit u1 is integrated with the power switch Q1 in the first chip U1 and the driving output terminal C1 and the gate G1 are combined into one terminal. The driving output terminal C2 is electrically coupled to a gate G2 of the power switch Q2. The power switch Q1 has a source for receiving an input power supply VIN and a drain which is electrically coupled to a drain of the power switch Q2. The power switch Q2 has a source which is electrically coupled to ground GND and a drain which provides an output signal LX. The gate and the drain of the power switch Q2 are formed on the front surface of the power switch Q2, and the source of the power switch Q2 is formed on the back surface of the power switch Q2.

Preferably, the bumps are one selected from the group consisting of copper posts, solder bumps, and composite bumps formed by electroless nickel immersion gold.

Figure 3C:
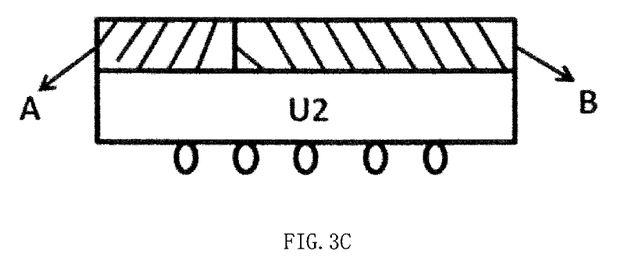
Figure 3D:
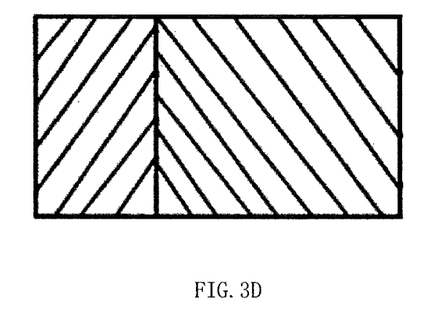

Next, a non-conductive layer A and a conductive layer B are formed in two different areas on the back surface of the second chip, for electrically insulating the first chip U1 from the second chip U2 and electrically coupling the first chip U1 to the second chip U2 respectively. Preferably, the conductive layer has a thickness the same as that of the non-conducting layer so that a first leadframe may then be firmly attached to the back surface of the second chip. The conductive layer has an area larger than that of the non-conductive layer to ensure electrical insulation from and coupling to the first chip, as shown in FIGS. 3C and 3D. FIG. 3D is a top view showing the structure of FIG. 3C.

Figure 3E:
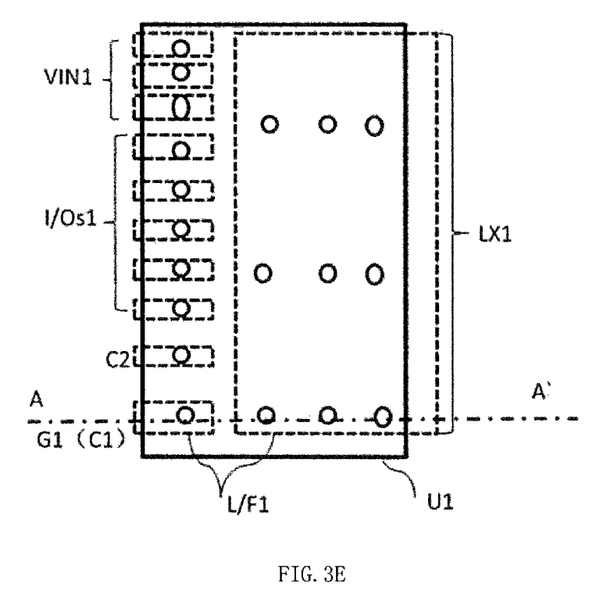

Next, a first leadframe L/F1 is provided, as shown in FIG. 3E. The first leadframe L/F1 has a plurality of leads which are electrically coupled to the respective terminals of the first chip by means of the bumps corresponding to the terminals on the front surface of the first chip. The bumps are used instead of bonding wires for electrical coupling, to avoid performance deterioration due to electrical resistance and electrical inductance introduced by the bonding wires. The leads may be finger-like or block-like. For example, the leads for the drain terminal, the I/O terminals, the gate terminal G1, the driving terminal C2 of the first chip U1 may be finger-like, the lead for the source terminal of the first chip U1 may be block-like. Alternatively, the lead for the source terminal of the first chip U1 may also be finger-like, which is block-like in this embodiment.

Figure 3F:
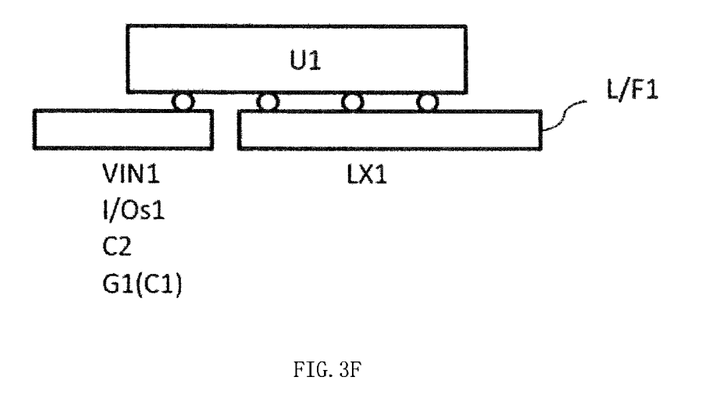

The first leadframe L/F1 has a group of finger-like leads at one side, including leads VIN1 being electrically coupled to the drain terminal of the first chip U1, leads I/Os1 being electrically coupled to the terminals I/Os1 of the first chip U1, a lead C2 being electrically coupled to the driving terminal C2 of the first chip U1. As mentioned above, the driving output terminal C1 and the gate G1 are combined into one terminal in the first chip U1. Thus, there may be no lead G1 for being electrically coupled to the gate G1 of the first chip U1. The first leadframe L/F1 has a block-like lead LX1 being electrically coupled to the source of the first chip U1 at the other side. The leads of the first leadframe L/F1 are insulated from each other. That is, the leads VIN1, I/Os1, G1, C2 and LX1 are insulated from each other. Reference may be further made to FIG. 3F, which is a cross-sectional view taken along line AA' in FIG. 3E.

Figure 3G:
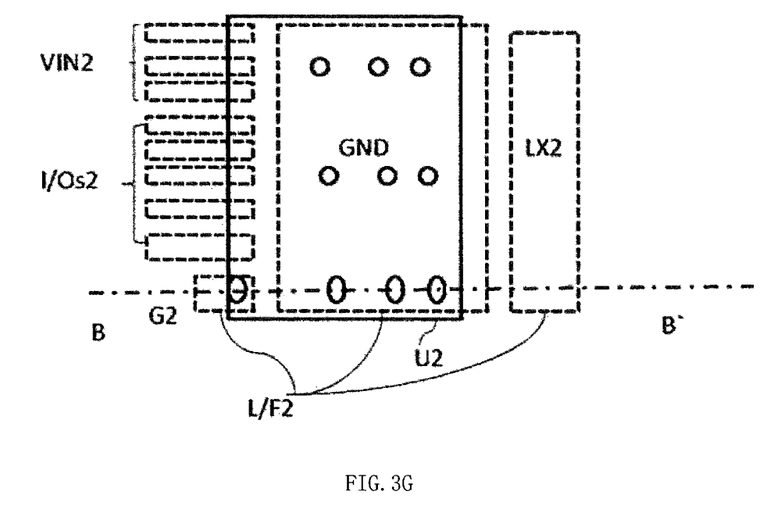

Next, a second leadframe L/F2 is provided, as shown in FIG. 3G. The second leadframe L/F2 has a plurality of leads which may be finger-like or block-like. For example, the second leadframe L/F2 includes finger-like leads for being electrically coupled to a gate terminal G2 on the front surface of the second chip U2, and the lead VIN1, the leads I/Os1 and the lead LX1 of the first leadframe L/F1, and a bock-like lead (alternatively, a finger-like lead) for being electrically coupled to the drain terminal of the second chip U2. Some leads of the second leadframe L/F2 are electrically coupled to the gate terminal G2 and the source terminal on the front surface of the second chip by means of the bumps corresponding to the terminals on the front surface of the second chip to avoid adverse effects of the bonding wires.

Figure 3H:
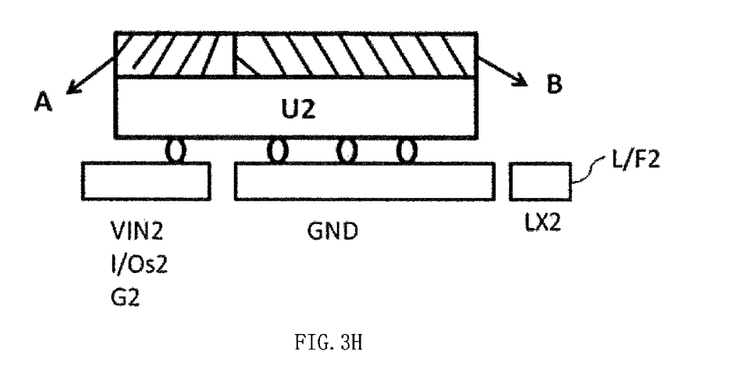

The second leadframe UF2 has a group of finger-like leads at one side, including a lead G2 for electrically coupling to the gate terminal G2 of the second chip U2, leads VIN2 for being electrically coupled to the leads VIN1, and leads I/Os2 for being electrically coupled to the leads I/Os1. The second leadframe has a block-like lead in a middle area for being electrically coupled to the source terminal on the front surface of the second chip. The second leadframe L/F2 has a group of finger-like leads or a block-like lead LX2 at the other side, for being electrically coupled to the lead LX1. The leads of the second leadframe L/F2 are electrically insulated from each other. That is, the leads VIN2, the leads I/Os2, the lead LX2 and the lead G2 are electrically insulated from each other. Reference may be further made to FIG. 3H, which is a cross-sectional view taken along line BB' in FIG. 3G.

Figure 3I:
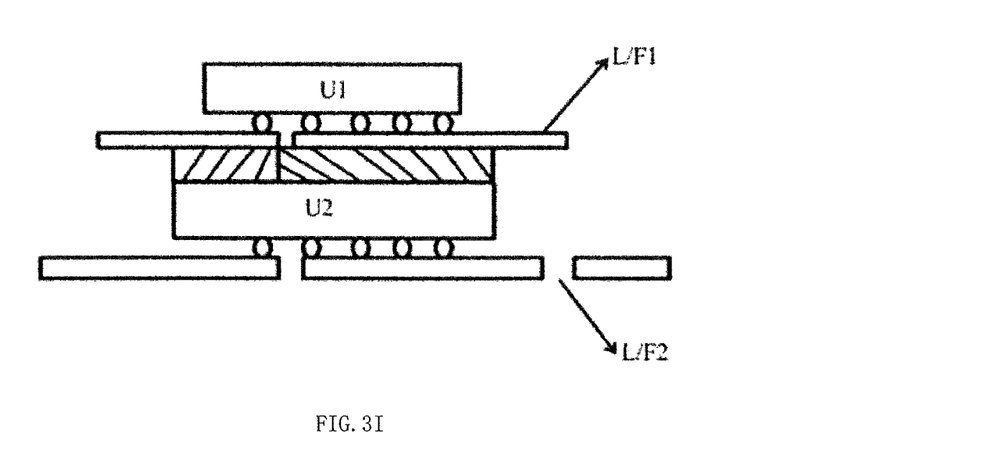

Next, the first leadframe is attached to the second chip in a back to back manner. One side of the first leadframe L/F1 where the finger-like leads are arranged is attached to the non-conducting layer of the back surface of the second chip, and the other side of the first leadframe where the block-like leads is attached to the conductive layer of the back surface of the second chip, respectively, as shown in FIG. 3I. Accordingly, the terminals I/Os, the drain terminal, the gate terminal G1 and the driving terminal C2 of the first chip U1 are electrically insulated from the drain terminal on the back surface of the second chip U2 by means the non-conductive layer, and the source terminal of the first chip U1 is electrically coupled to the drain terminal on the back surface of the second chip U2 by means of the conductive layer.

Figure 3J:
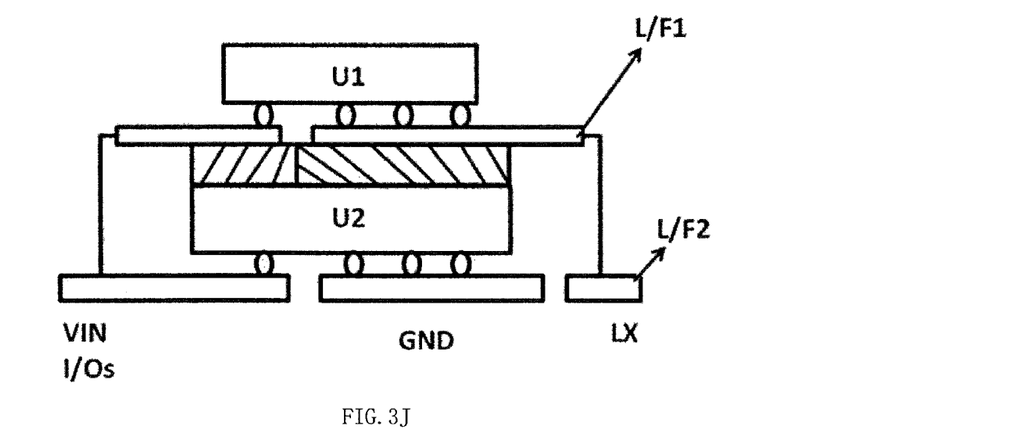

Next, the leads of the first leadframe are electrically coupled to the corresponding leads of the second leadframe by means of a group of electrical wires, as shown in FIG. 3J. In this embodiment, 1. the lead C2 of the first leadframe, which is in turn electrically coupled to the driving terminal C2 of the first chip U1, is electrically coupled to the lead G2 of the second leadframe, which is in turn electrically coupled to the gate terminal G2 of the power switch Q2 of the second chip U2; the leads I/Os1 of the first leadframe, which is in turn electrically coupled to the input/output terminal I/Os of the first chip U1, is electrically coupled to the leads I/Os2 of the second leadframe, for providing the lead I/Os for an external circuit;

2. the leads LX1 of the first leadframe, which are in turn electrically coupled to the source terminal of the power switch Q1 of the first chip U1, are electrically coupled to the leads LX2 of the second leadframe, which are in turn electrically coupled to the drain terminal of the power switch Q2 of the second chip U2, for providing the lead LX for an external circuit; and 3. the leads VIN1 of the first leadframe, which are in turn electrically coupled to the drain terminal of the power switch Q1 of the first chip U1, are electrically coupled to the leads VIN2 of the second leadframe, for providing the lead VIN for an external circuit.

Moreover, the block-like lead of the second leadframe, which is in turn electrically coupled to the source terminal of the power switch Q2 of the second chip U2, provides the lead GND for the external circuit.

Furthermore, the lead GND of the second leadframe is a block-like lead having a relatively large area. Thus, the block-like GND lead may be directly used as a pad for soldering, when the second leadframe is attached to the printed circuit board (PCB). Thus, the resultant stacked package may have less number of leads, small package size, and convenience for routing on the PCB.

Furthermore, the electrical wires may be implemented with various interconnect technologies. In this embodiment, the electrical wires may be copper clips.

Figure 5:
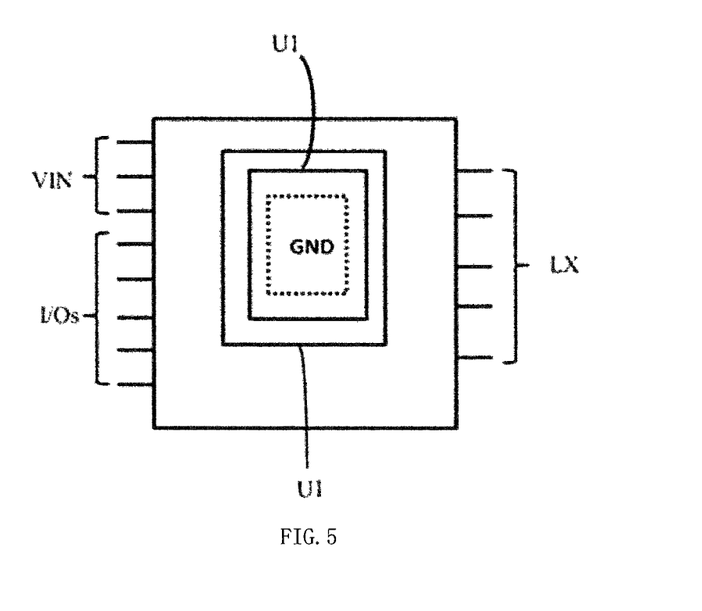
FIG. 5 is a top view showing an example stacked package structure after encapsulation of a voltage regulator according to an embodiment of the present disclosure.

Finally, the first chip, the second chip, the conductive layer, the non-conductive layer, the plurality of bumps, the first leadframe, the second leadframe and the group of electrical wires, as shown in FIG. 3J, are encapsulated into a stacked package of a voltage regulator, as shown in FIG. 5. FIG. 5 is a top view of the stacked package after encapsulation. The stacked package according to the present disclosure has a reduced package area. Moreover, the stacked package according to the present disclosure incorporates a flip chip package using the bumps, instead of the bonding wires, which further reduces the package size and increases the integration density of the chip package.

The embodiments were chosen and described in order to best explain the principles of the disclosure and its practical applications, to thereby enable others skilled in the art to best utilize the disclosure. The disclosure is intended to cover alternatives, modifications and equivalents that may be included within the spirit and scope of the disclosure as defined by the appended claims.

What is claimed is:

1. A method for fabricating a stacked package of a voltage regulator, comprising:
    forming a first chip by integrating a gate driving circuit with a first power switch, forming a second chip having a second power switch, arranging a plurality of terminals on a front surface of said first chip and on a front surface of said second chip, and arranging a plurality of terminals on a back surface of said second chip;
    forming a group of bumps corresponding to said plurality of terminals on said front surface of said first chip and on said front surface of said second chip;
    forming a non-conductive layer and conductive layer side by side on said back surface of said second chip, for electrically insulating said first chip from said second chip and electrically coupling said first chip to said second chip respectively;
    providing a first leadframe and a second leadframe each having at least a group of leads, all of said leads of said first leadframe being electrically coupled to said terminals on said front surface of said first chip by means of said bumps of said first chip, and some of said leads of said second leadframe being electrically coupled to said terminals on said front surface of said second chip by means of said bumps of said second chip;
    electrically coupling said back surface of said first leadframe to said back surface of said second chip;
    electrically coupling said leads of said first leadframe to the corresponding ones of said second leadframe by using a group of electrical wires so that said leads of said second leadframe may be coupled to an external circuit; and
    encapsulating said first chip, said second chip, said conductive layer, said non-conductive layer, said plurality of bumps, said first leadframe, said second leadframe and said group of electrical wires in a stacked package.

2. The method according to claim 1, further comprising: attaching a printed circuit board to said back surface of said second leadframe.

3. The method according to claim 1, wherein said leads are finger-like or block-like.

4. The method according to claim 1, wherein said conductive layer has a thickness same as that of said non-conductive layer.

5. The method according to claim 1, wherein said conductive layer has an area larger than that of said non-conductive layer.

6. The method according to claim 1, wherein said electrical wires are copper clips.

7. The method according to claim 1, wherein said bumps are one selected from said group consisting of copper posts, solder bumps, and composite bumps formed by electroless nickel immersion gold.

8. The method according to claim 1, wherein said voltage regulator is a switching voltage regulator.

9. A stacked package of a voltage regulator, comprising:
    a first chip having a gate driving circuit and a first power switch which are integrated with each other, said first chip having a front surface with a plurality of terminals thereon;
    a second chip having a second power switch, said second chip having a front surface and a back surface with a plurality of terminals thereon;
    a non-conductive layer and conductive layer side by side on said back surface of said second chip, for electrically insulating said first chip from said second chip and electrically coupling said first chip to said second chip respectively;
    a first leadframe and a second leadframe each having at least a group of leads, said back surface of said first leadframe being electrically coupled to said back surface of said second chip;
    a group of bumps corresponding to said terminals on said front surface of said first chip and on said front surface of said second chip respectively, for electrically coupling said terminals on said front surface of said first chip to said leads of said first leadframe and electrically coupling said terminals on said front surface of said second chip to some of said leads of said second leadframe respectively;
    a group of electrical wires for electrically coupling said leads of said first leadframe to said leads of said second leadframe; and
    an encapsulant for encapsulating said first chip, said second chip, said conductive layer, said non-conductive layer, said plurality of bumps, said first leadframe, said second leadframe and said group of electrical wires.

10. The stacked package according to claim 9, further comprising: a printed circuit attaching to said back surface of said second leadframe.

11. The stacked package according to claim 9, wherein said leads are finger-like or block-like.

12. The stacked package according to claim 9, wherein said conductive layer has a thickness said same as that of said non-conductive layer.

13. The stacked package according to claim 9, wherein said conductive layer has an area larger than that of said non-conductive layer.

14. The stacked package according to claim 9, wherein said electrical wires are copper clips.

15. The stacked package according to claim 9, wherein said bumps are one selected from said group consisting of copper posts, solder bumps, and composite bumps formed by electroless nickel immersion gold.

* * * * *